(12) United States Patent
Hofmann (10) Patent No.: US 7,893,519 B2
(45) Date of Patent: Feb. 22, 2011

(54) INTEGRATED CIRCUIT WITH CONDUCTIVE STRUCTURES

(75) Inventor: Franz Hofmann, Munich (DE)

(73) Assignee: Qimonda AG, Munich (DE)

( * ) Notice: Subject to any disclaimer, the term of this patent is extended or adjusted under 35 U.S.C. 154(b) by 88 days.

(21) Appl. No.: 12/128,336

(22) Filed: May 28, 2008

(65) Prior Publication Data

US 2009/0294895 A1    Dec. 3, 2009

(51) Int. Cl.
*H01L 29/00* (2006.01)
(52) U.S. Cl. .................................................. 257/506
(58) Field of Classification Search .................. None
See application file for complete search history.

(56) References Cited

U.S. PATENT DOCUMENTS

| 5,867,429 | A | 2/1999 | Chen et al. | |
|---|---|---|---|---|
| 7,598,561 | B2 * | 10/2009 | Chen et al. | 257/315 |
| 2002/0167043 | A1 | 11/2002 | Hashimoto | |
| 2004/0012998 | A1 | 1/2004 | Chien et al. | |
| 2006/0145241 | A1 | 7/2006 | Forbes et al. | |
| 2006/0208309 | A1 | 9/2006 | Forbes et al. | |
| 2007/0096202 | A1 | 5/2007 | Kang et al. | |

* cited by examiner

*Primary Examiner*—Scott B Geyer
(74) *Attorney, Agent, or Firm*—Edell, Shapiro & Finnan, LLC

(57) ABSTRACT

An integrated circuit includes an array of transistors and a number of wordlines, where individual ones of the wordlines are coupled to a number of the transistors in the array. Conductive structures that are insulated from the wordlines are disposed in a layer beneath the wordlines and are arranged between the transistors.

16 Claims, 12 Drawing Sheets

INTEGRATED CIRCUIT WITH CONDUCTIVE STRUCTURES

FIELD OF THE INVENTION

The present specification generally relates to an integrated circuit comprising memory cells and a shielding structure as well as to a method for manufacturing the same.

BACKGROUND

Non-volatile semiconductor memories are gaining increasing importance in the field of multimedia and other applications. For example, non-volatile memories are nowadays used in a broad variety of electronic devices such as cellular telephones, digital cameras, personal digital assistants, mobile computing devices, non-mobile computing devices and many other electronic devices.

For example, non-volatile memories may utilize a floating gate as charge storage region that is positioned above and insulated from a channel region in a semiconductor substrate. A control gate is provided over and insulated from the floating gate. The floating gate can store charges and can therefore be programmed/erased between different states, e.g., binary "1" and binary "0." Recently, multi-level non-volatile memory cells also have been developed.

Moreover, non-volatile memories may also be based upon charge trapping technology. As charge trapping stacks for example, SONOS (silicon-oxide-nitride-oxide-silicon) and TANOS (tantal nitride-aluminum oxide-nitride-oxide-silicon) stacks may be used. In these stacks, the silicon nitride layer serves as charge storage layer.

In so-called NAND flash memories, NAND strings of non-volatile memory cells are connected in series. The ends of such NAND strings are connected to a common bit line and a common source-line by respective select transistors.

With increasing integration smaller than 45 nm, it becomes an increasingly challenging task to avoid capacitive coupling between neighboring floating gates which might influence neighboring memory cells.

SUMMARY

An integrated circuit comprises an array of transistors and a plurality of wordlines. Individual wordlines are coupled to a plurality of the transistors of the array. Conductive structures are disposed in a layer beneath the wordlines and are arranged between the transistors. The conductive structures are insulated from the wordlines.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. In the figures, identical reference numerals denote equivalent or functionally equivalent components.

DETAILED DESCRIPTION

In the following detailed description reference is made to the accompanying drawings, which form a part hereof and in which are illustrated by way of illustration specific embodiments in which the invention may be practiced. In this regard, directional terminology such as "top," "bottom," "front," "back," "leading," "trailing" etc. is used with reference to the orientation of the figures being described. Since components of embodiments of the invention can be positioned in a number of different orientations, the directional terminology is used for purposes of illustration and is in no way limiting. Is to be understood that other embodiments may be utilized and structural or logical changes may be made without departing from the scope defined by the claims.

FIG. 1 shows a schematic layout for illustrating an integrated circuit according to an approach of the invention.

An integrated circuit comprises an array of transistors 18, wordlines 20, and conductive structures 19. The wordlines 20 may be arranged in such a manner that a plurality of the transistors 18 are connected with one of the wordlines, respectively. The conductive structures 19 are insulated from the wordlines 20. The conductive structures 19 are arranged between the transistors 18 and they are disposed in the layer beneath the wordlines 20. The transistors 18 are formed in active areas 15. The active areas 15 may be portions of monocrystalline silicon forming a part of a substrate.

The terms "wafer," "substrate," "semiconductor chip," or "semiconductor substrate" used in the context of the present description may include any semiconductor-based structure that has a semiconductor substrate. Wafer and substrate are to be understood to include silicon, silicon-on-insulator (SOI), silicon-on-sapphire (SOS), doped and undoped semiconductors, epitaxial layers of silicon supported by a base crystalline material, and other semiconductor structures. The semiconductor need not be silicon-based. The semiconductor could as well be, among others, silicon-germanium, germanium or gallium arsenide. Various components may already be formed in the substrate. Moreover, different layers may be embedded in the substrate material.

Figure 1A:
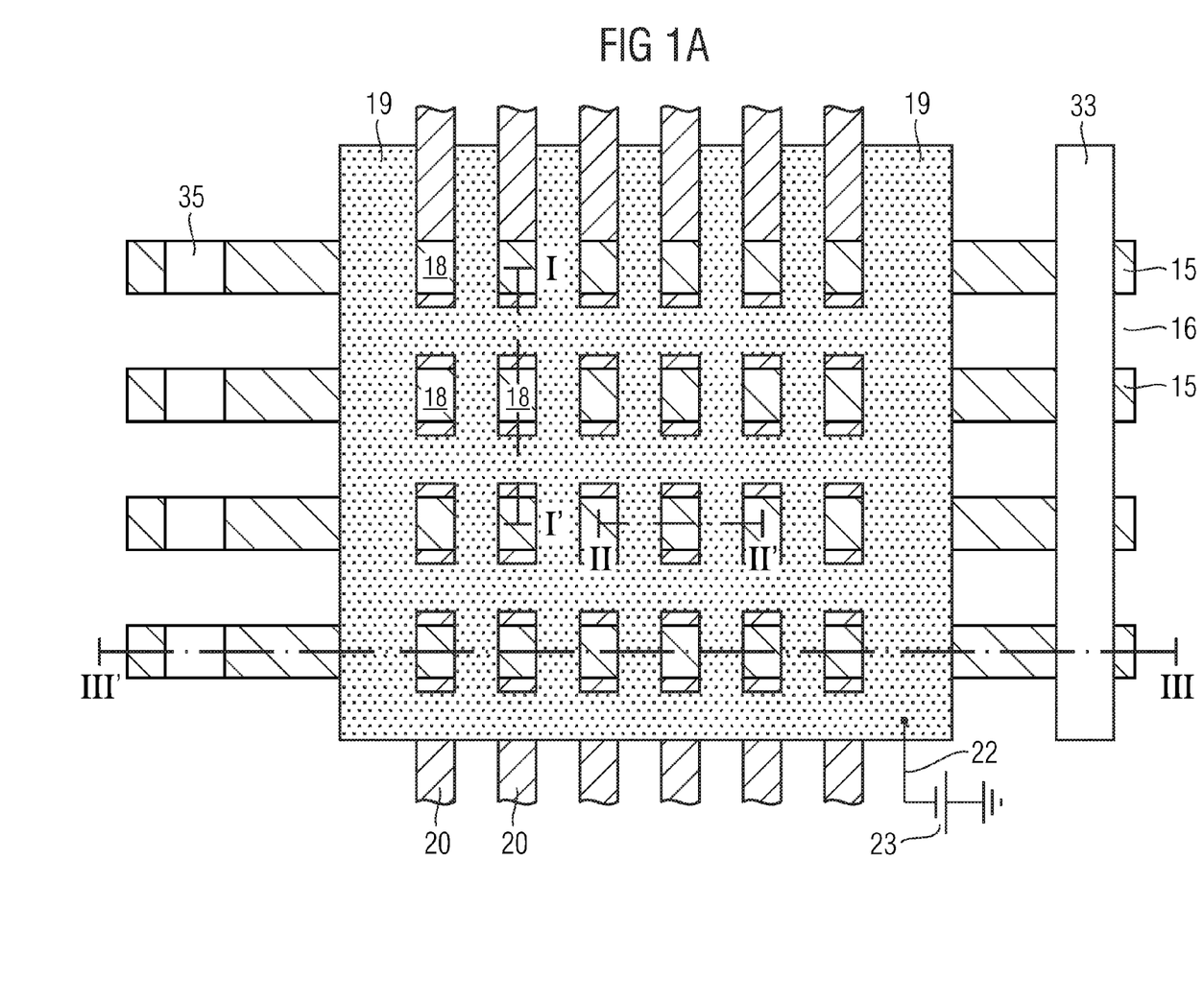
FIGS. 1A and 1B show layouts for illustrating an integrated circuit in the form of a memory device according to an approach of the present invention.
Figure 1B:
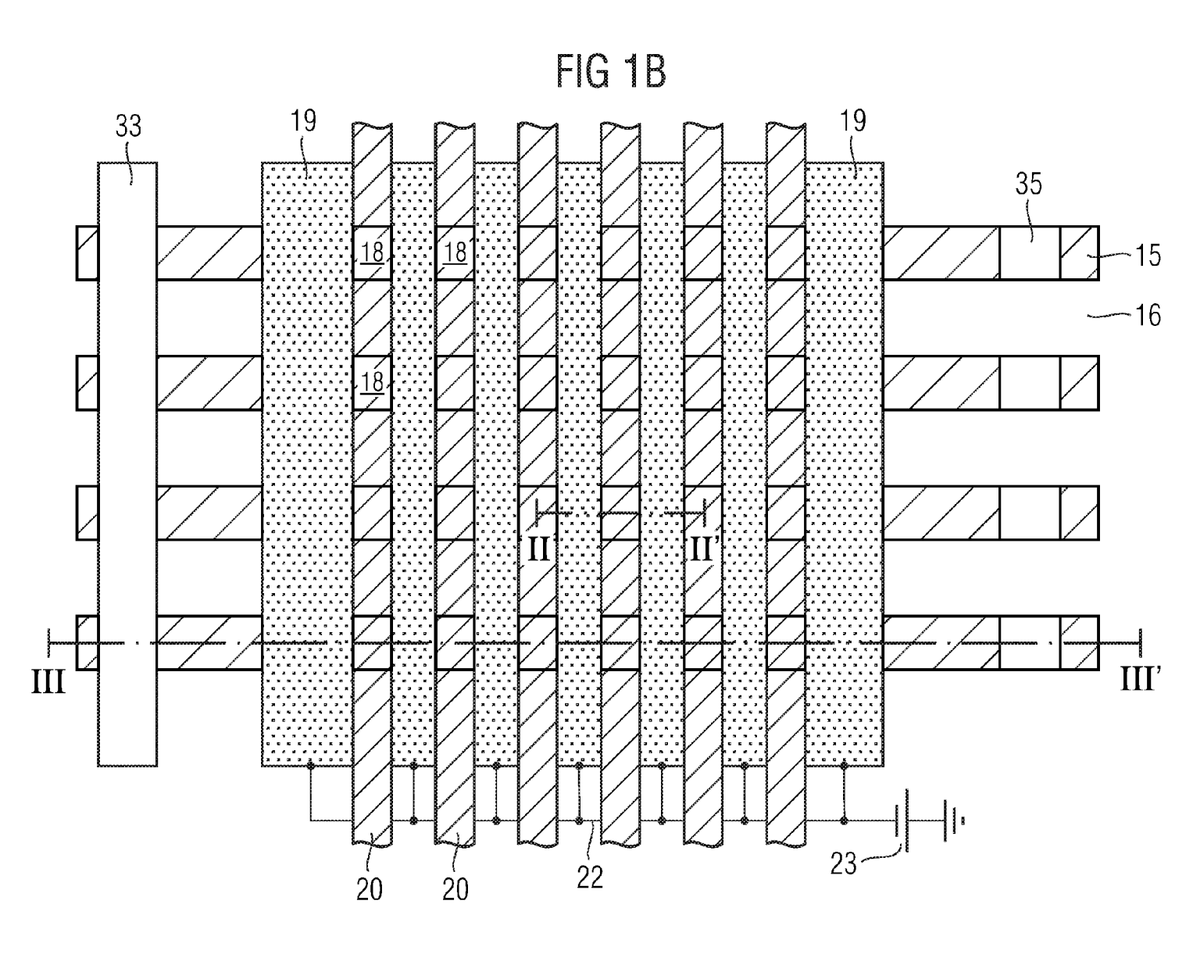

For example, adjacent active areas 15 may be insulated from each other by isolation trenches 16 that may be filled with an insulating material. The transistors 18 may be arranged in an array comprising rows and columns. The transistors 18 that are assigned to one single active area 15 may be also denoted as a NAND string. A source line 33 may be provided so as to address a single NAND string and a bit line contact 35 may be disposed so as to obtain a signal from the NAND string. The conductive structures 19 may be arranged in the form of a grid. For example, the conductive structures 19 may comprise lines extending parallel to the wordlines and lines that extend parallel to the active areas 15. According to another embodiment, as is shown in FIG. 1B, the conductive structures 19 may extend in one direction, for example, extending parallel to the wordlines 20. As is to be clearly understood, the conductive structures 19 may extend in any other configuration as well. The integrated circuit may further comprise an interconnection 22 that is configured to connect the conductive structures 19 with a voltage source 23. According to a further embodiment, the conductive structures 19 may be also connected with more than one voltage sources 23. For example, every second conductive structure 19 may be connected with a second voltage source 23, every first conductive structure 19 being connected with the first voltage source, or any other connecting scheme may be employed.

According to another embodiment, an integrated circuit may comprise an array of transistors 18, wordlines 20, conductive structures 19, and an interconnection 22. The transistors 18 may be arranged in an array. A plurality of the transistors 18 is connected with one of the wordlines 20, respectively. The conductive structures 19 are insulated from the wordlines 20. The interconnection 22 is configured to connect any of the conductive structures 19 with a fixed potential.

Figure 2:
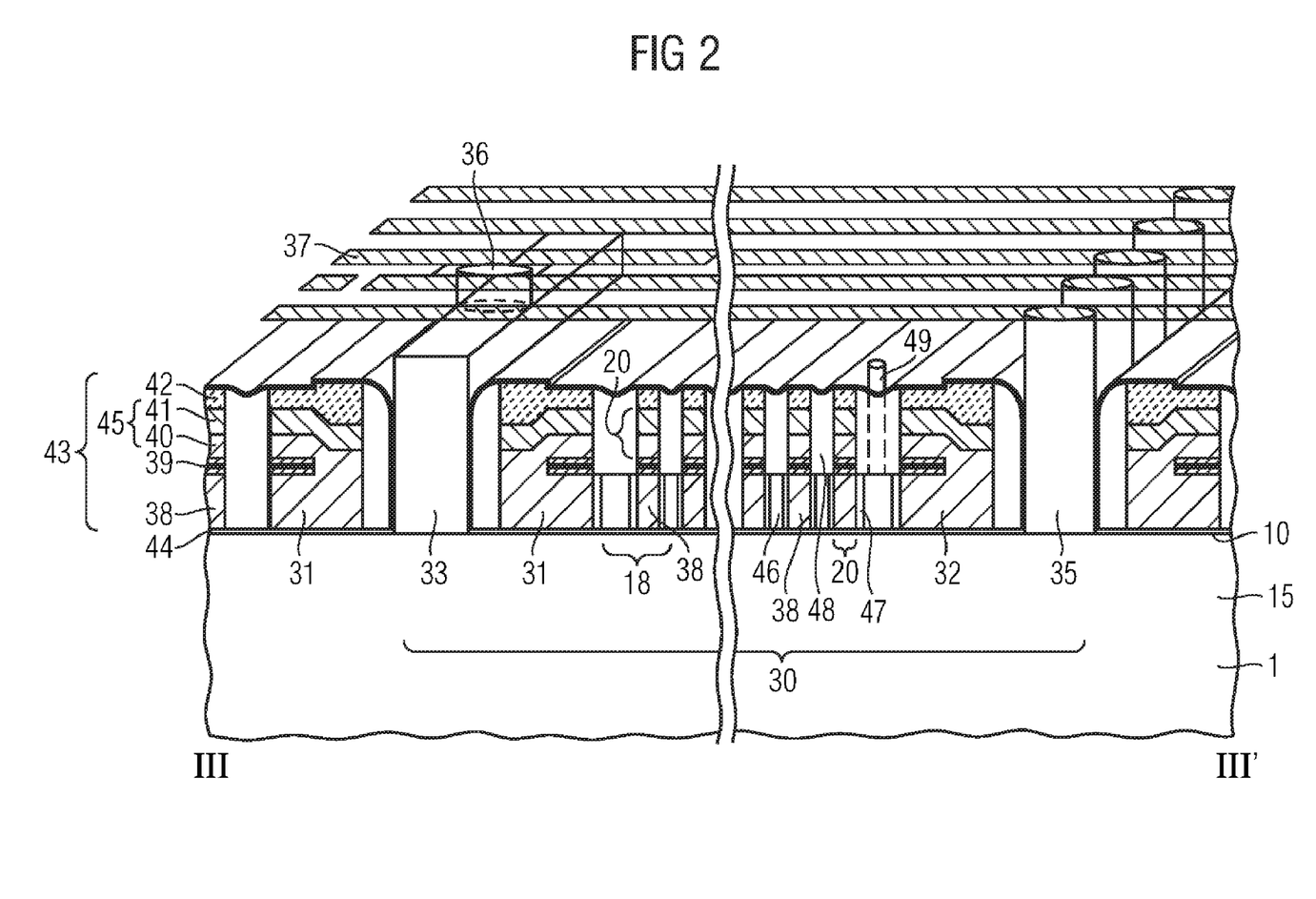
FIG. 2 shows a cross-sectional view of a memory device including conductive structures.

FIG. 2 schematically shows a portion of a NAND-type flash memory device comprising floating gate memory cells. In such a NAND-type flash memory device a plurality of transistors 18 are connected in series. Each memory cell is formed in an active region 15 formed within the substrate 1. Each memory cell further comprises a gate stack 43. A barrier layer 44 is disposed as to insulate the gate stack 43 from the substrate 1. Each of the gate stacks 43 comprises a storage layer 38 forming the floating gate. For example, the storage layer 38 may comprise a polysilicon layer. The storage layer 38 is disposed between the barrier layer 44 and a dielectric layer or dielectric layer system 39. For example, the dielectric layer system 39 may comprise a silicon oxide-silicon nitride-silicon oxide layer stack. According to another embodiment, the dielectric layer 39 may comprise a high-k dielectric. High-k materials may be defined as having a dielectric constant which is greater than the dielectric constant of silicon dioxide. Examples for high-k-materials include transition metal oxides, zirconium, hafnium-oxide, lead zirconium titanate, tantalum oxide, silicon nitride, and/or barium strontium titanate. Further examples include combinations or mixtures of any of these materials.

A control gate 45 may be disposed over the dielectric layer (system). For example, the control gate 45 may comprise a polysilicon layer 40, followed by a metal layer 41, that may be tungsten, for example. The gate stack 43 may comprise further layers, for example, a capping layer 42, that may be made of a dielectric material.

Groups of storage transistors 18 or memory cells are arranged along a bit line direction and form a NAND-string 30. First select transistors 31 connect the NAND-strings 30 to a source line. A source line shunt 33 may be disposed over the buried source line. The source line shunt 33 is arranged between the gate stacks of two first select transistors 31 of neighboring NAND-strings 30 that are arranged along a bit line direction.

Source line vias 36 may connect the source line shunt 33 to a connection line that may be formed in a corresponding plane or layer of the memory device. The source line shunt 33 is connected to a plurality of neighboring NAND-strings 30. As is clearly to be understood, the connection of NAND-strings 30 to a source line may be implemented in any arbitrary manner. A second select transistor 32 connects the NAND-string 30 to a corresponding bit line contact 35. The bit line contacts 35 of neighboring NAND-strings 30 are connected to bit lines 37. In an array of NAND-strings 30, a plurality of NAND-strings 30 are arranged in a parallel manner. Accordingly, a storage layer 38 may be segmented to form the respective NAND-strings 30. Moreover, the control gates 45 may form part of a corresponding wordline 20. Accordingly, the control gates 45 may be formed as continuous wordlines. According to another embodiment, a layer portion of the control gate 45, for example, the conductive layer 41, may be formed as continuous wordlines, the underlying polysilicon layer 40 being formed as segmented portions of the control gate, respectively.

As is shown in FIG. 2, between two adjacent portions of the storage layer 38, a conductive structure 46 is disposed. The conductive structure 46 may be insulated from the storage layer 38 by an insulating liner 47. Moreover, on top of the conductive structure 46 a dielectric material 48 is disposed. The conductive structure 46 may have a pattern as is illustrated in FIGS. 1A and 1B (conductive layer 19), respectively. As is clearly to be understood, any other pattern of the conductive structure 46 may be implemented. For example, the conductive structure 46 may be connected via an interconnection 49 to an external voltage source or may be grounded, for example. In the following, an example of an operation mode of the memory device will be explained.

When reading an information stored in the memory device shown in FIG. 2, a suitable voltage is applied to the conductive structure 46 via the connection structure. Accordingly, neighboring floating gates are shielded from each other, so that the threshold voltage of a single gate is not influenced by its neighbors. Moreover, by applying a suitable voltage to the conductive structure, the conduction bands in the monocrystalline silicon portion beneath the conductive structure 46 may be bent so that a source/drain like portion may be formed. For example, the source/drain portion may be formed without performing a doping of the substrate at this portion. Hence, the conduction in the NAND string may be accomplished without any further implantation step that might degrade the floating gate of the cell transistors. Accordingly, the conductive structure acts an auxiliary gate electrode forming a conductive well at a substrate portion beneath the conductive structure 46.

As is shown in FIG. 2, the conductive structures 46 are disposed in a layer beneath the wordlines 20. For example, the conductive structures 46 may be disposed in a layer of the storage layer 38. Accordingly, the upper surface of the storage layer 38 is disposed approximately at the same height as the upper surface of the conductive structure 46. Moreover, the upper surface of the conductive structure 46 is disposed beneath the lower surface of the control gate 45. Moreover, the conductive structures 46 extend in a direction that is parallel to a horizontal surface of a semiconductor substrate. Accordingly, the conductive structures are portions of a planar layer. Moreover, as is shown in FIG. 2 the charge storing layer may be disposed parallel to a horizontal surface of the semiconductor substrate. Accordingly, the conductive structure as well as the charge storing layer may be disposed parallel to each other. The conductive structure 46 may be formed over the barrier layer 44. The conductive structure 46 may be insulated by an insulating sidewall liner 47 from the storage layer 38. As is shown in FIG. 2, the conductive structure 46 may have a vertical cross-section. According to another embodiment, the insulating layer 47 may be formed as a conformal liner covering the sidewalls as well as for example a portion between adjacent portions of the charge storage layer 38. Accordingly, in this case, as will be explained later with reference to FIGS. 11A and 11B, the insulating layer 47 has a shape of a "U," the conductive structure 46 filling the inner portion between the vertical portions of the "U."

Accordingly, the floating gate stacks 38 are at least partially surrounded by insulating sidewall spacers, e.g., made of silicon oxide. Conductive structures 19, 46 are arranged around the floating gate layer of the floating gate stacks FG in order to provide an electromagnetic shielding between neighboring floating gate layers so as to prevent capacitive crosstalk there between.

The conductive structures 19, 46 may comprise any conductive material, for example, including polysilicon, metals or carbon or carbon-containing materials and combinations of different conductive materials.

The conductive structures positively prevents a capacitive coupling between neighboring floating gates, which results in the effect that there is no threshold voltage shift caused by the charge status of a neighboring memory cell.

As is clearly to be understood, the memory device shown in FIG. 2 is only by way of an example. As an alternative, the transistor 18 may be implemented as any other type of transistor or storage transistor, respectively. For example, other types of Flash memory cells or other types of memory cells may be employed. Moreover, the transistor 18 may form part of a multi-level memory device in which multiple layers of transistors are disposed above each other.

Figure 3:
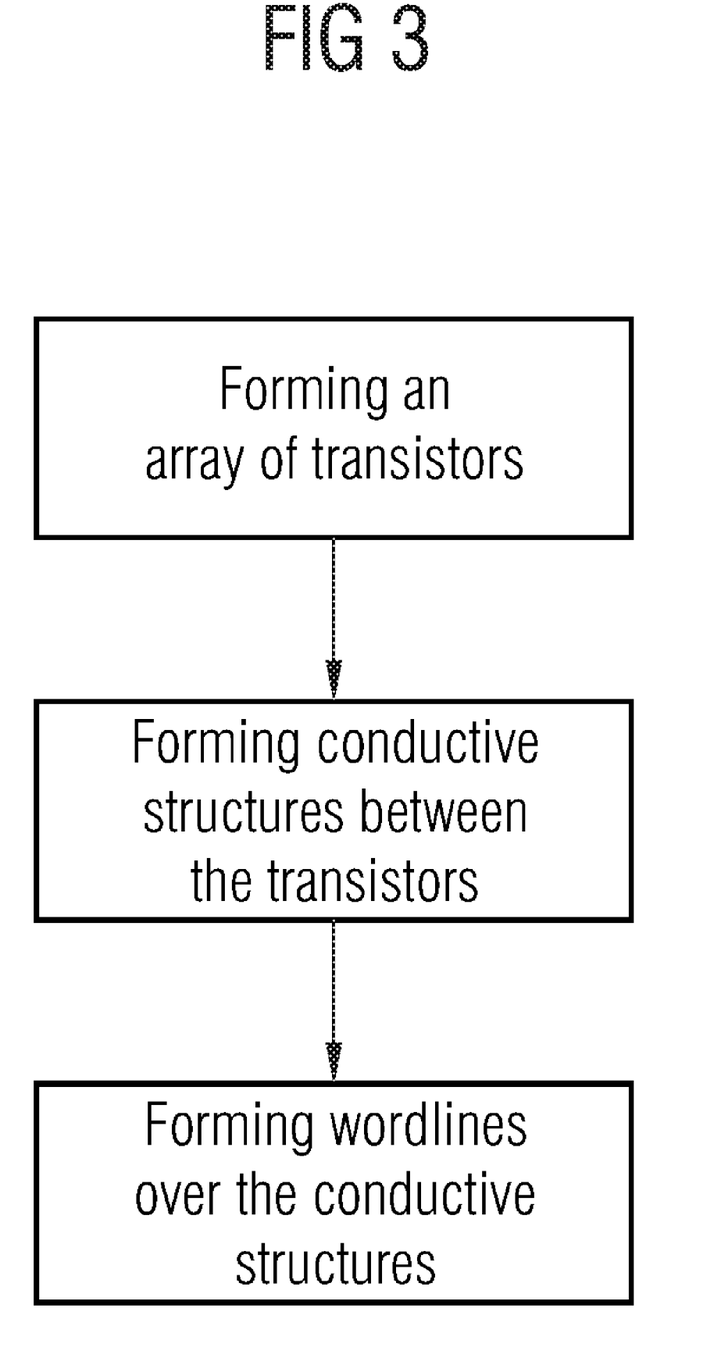
FIG. 3 shows a flow-chart illustrating the method according to an embodiment.

FIG. 3 schematically illustrates a method for manufacturing an integrated circuit. A method for manufacturing an integrated circuit may comprise forming an array of transistors, forming conductive structures between the transistors, and forming wordlines over the conductive structures (i.e., in a layer above the layer in which the conductive structures are formed). The method may be performed in such a manner that the wordlines are connected with a plurality of the transistors and the wordlines are insulated from the conductive structures.

For example, forming the array of transistors may comprise forming and patterning a charge storage layer.

For example, forming the conductive structures may comprise forming an insulating structure at the sidewalls of the patterned charge storage layer, forming a conductive layer between the insulated patterned storage layer and removing the conductive layer in an upper portion.

FIGS. 4 to 11 show schematic layouts in cross section for illustrating a manufacturing method for an integrated circuit in the form of a memory device according to the approach of the present invention, namely a) as a cross-section I-I' in FIG. 1A and b) as a cross-section II-II' in FIGS. 1A and 1B.

Figure 4:
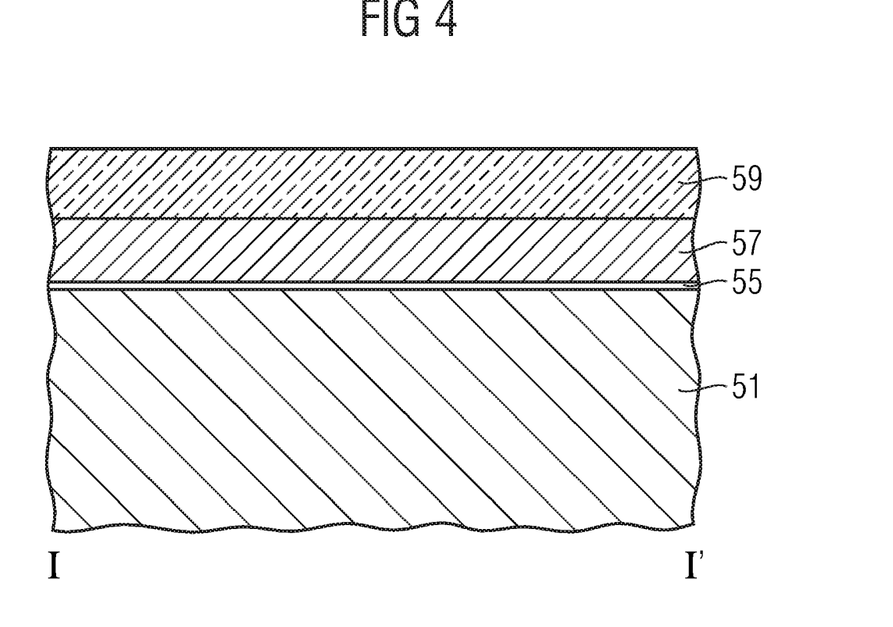
FIG. 4 shows an example of a substrate when performing the method according to an embodiment.

In FIG. 4, reference numeral 51 denotes a silicon semiconductor substrate. A barrier layer 55 is formed on a main surface 52. The barrier layer 55 may be made of silicon oxide that may be thermally grown and may act as a tunnel oxide layer. On the barrier layer 55, there is a first polysilicon layer 57 which represents the floating gate layer or charge storage layer. On top of the polysilicon layer 57, there is a hard mask layer 59. For example, the hard mask layer may comprise silicon nitride.

Figure 5:
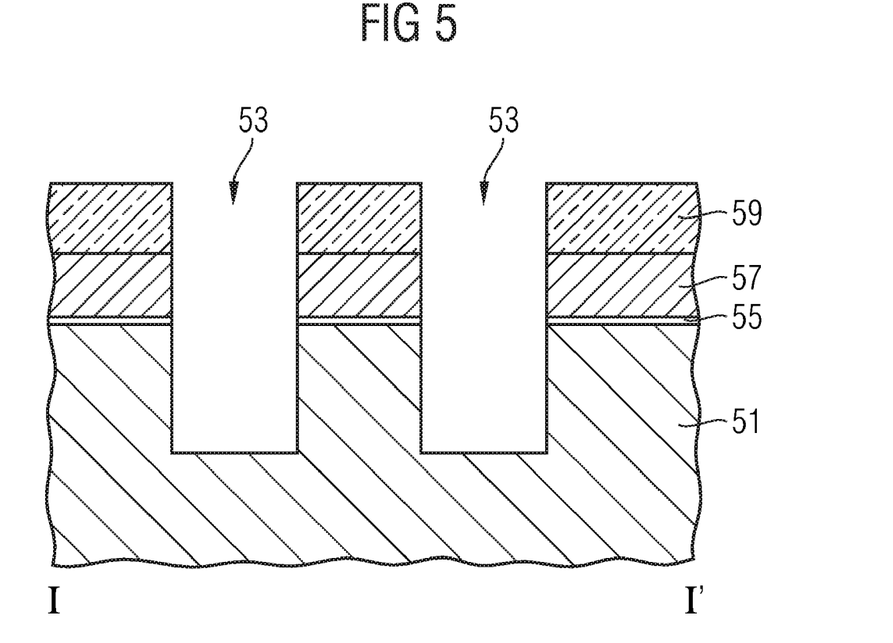
FIG. 5 shows a cross-sectional view of the substrate after performing a further processing step.

In FIG. 5 the hard mask layer 59 is patterned into stripes that run parallel to the active area lines along which the NAND-strings 30 are to be formed.

After the hard mask layer 59 has been patterned, an etching process will be conducted in order to form isolation trenches 53 between the active area lines on which the NAND-strings are to be formed.

Figure 6:
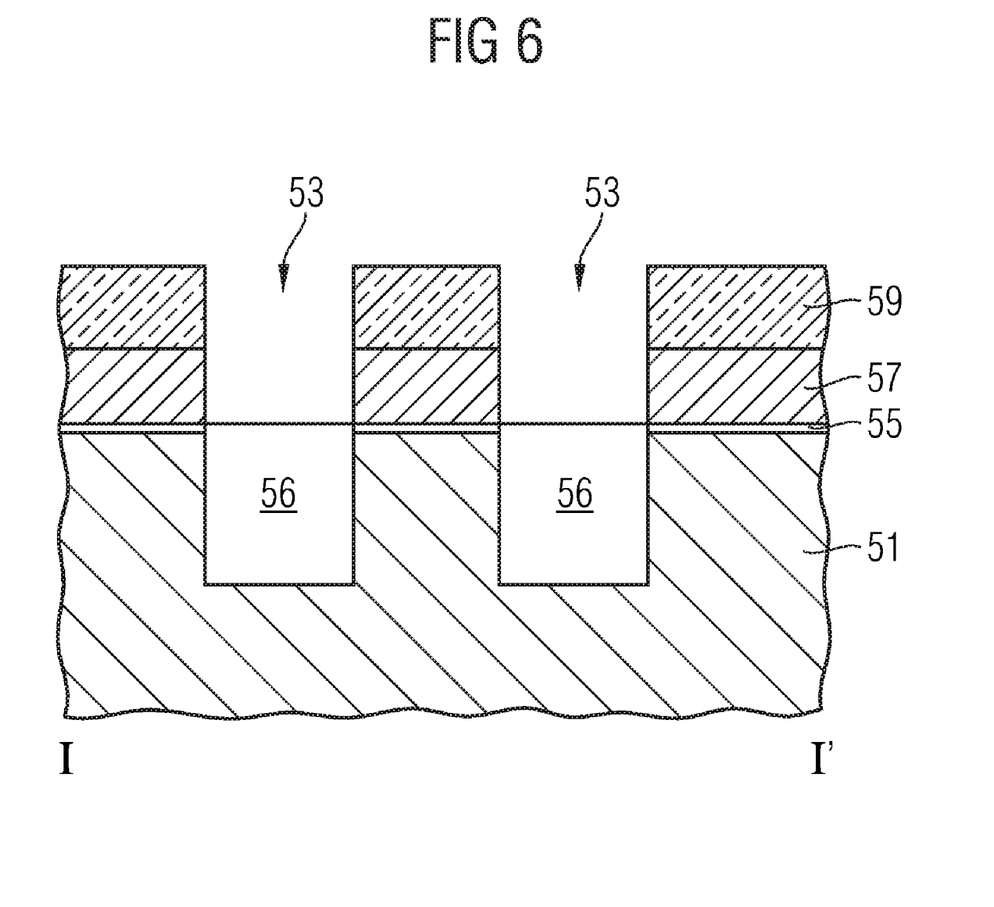
FIG. 6 shows a cross-sectional view of a substrate after performing a further processing step.

In a subsequent process step which is depicted in FIG. 6, an insulating layer or layer stack 56 is filled in the isolation trenches 53. For example the insulating layer 56 may comprise silicon oxide and, optionally, silicon nitride. By way of example, the insulating layer stack 56 may be is deposited over the entire structure of FIG. 6 and thereafter polished back to the upper surface of the hard mask layer 59, and finally etched back to the upper surface of the barrier layer 55.

Thereafter, the charge storage layer 57 may be separated in a direction perpendicular to the direction of the isolation trenches 53. For example a (not shown) photo mask may be formed that exposes stripes that extend perpendicularly to the stripes of the hard mask layer 59. Using the (not shown) photo mask, separation trenches 58 are formed in an etching step that stops on the barrier layer 55. Thereafter, the (not shown) photo mask is removed. After formation of the trenches 58, the floating gate or storage layer 57 stacks are separated from each other and form pillars which are arranged in rows and columns.

Figure 7A:
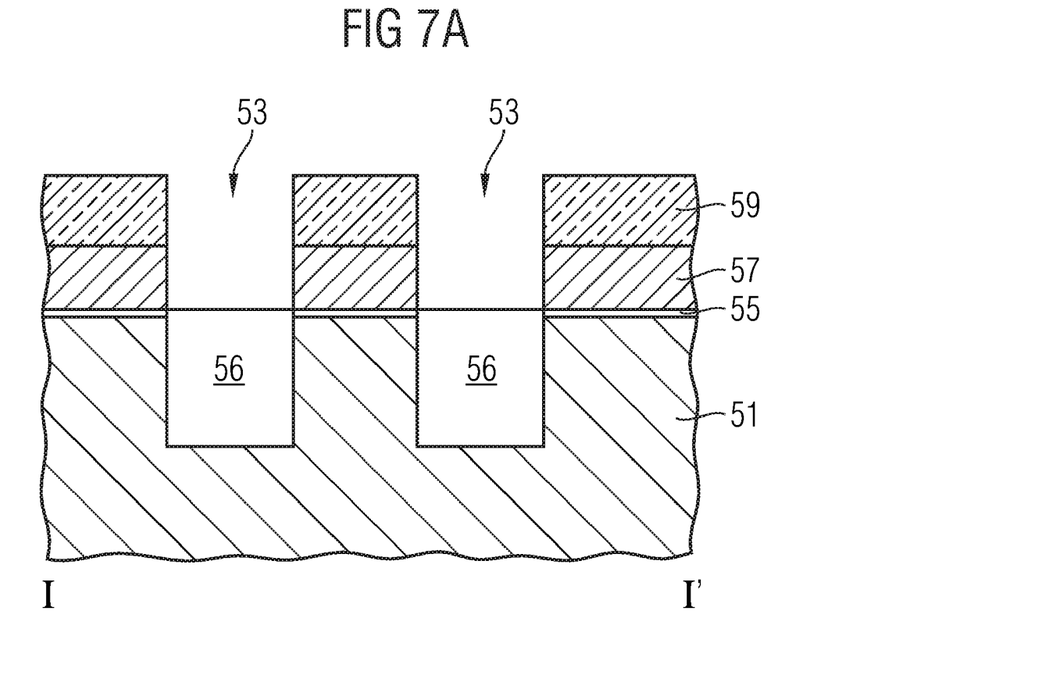
FIGS. 7A and 7B show cross-sectional views of an example of a substrate after performing a further processing step.
Figure 7B:
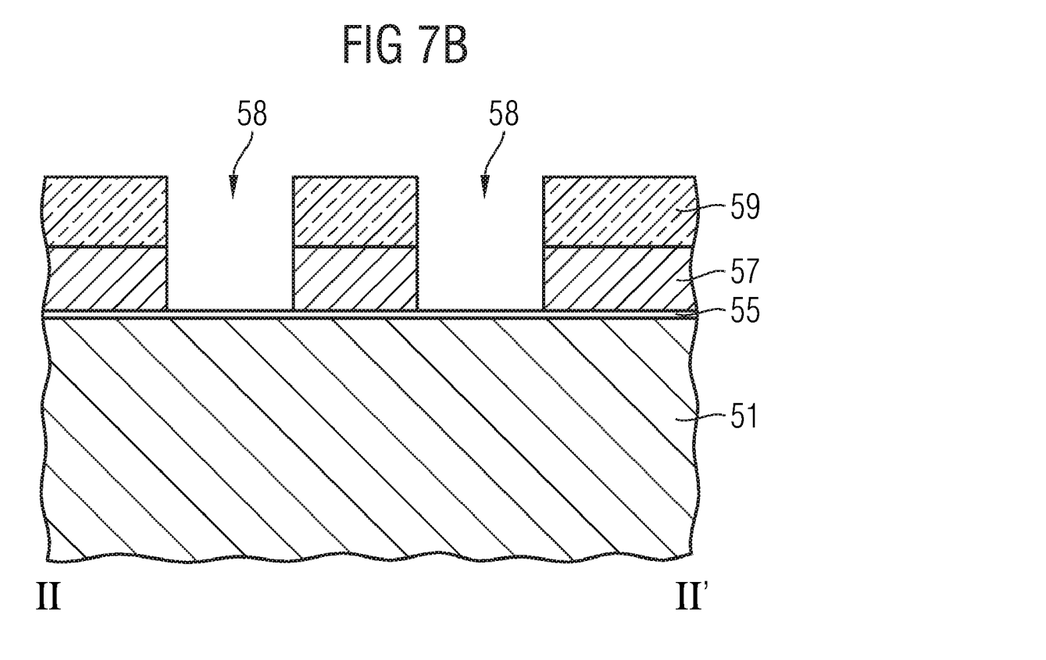

FIGS. 7A and 7B, respectively, show cross-sectional views of an example of a substrate after performing the described processing steps. FIG. 7A shows the cross-sectional view between I and I' that is taken in a plane perpendicular to the direction of the isolation trenches 53. As is shown, the isolation trenches 53 are filled with an insulating material 56. The upper surface of the insulating material 56 may be adjusted in such a manner that the surface of the insulating layer 56 is approximately at the same height as the upper surface of the barrier layer 55. In the direction that is taken parallel to the direction of an active area, trenches 58 are formed. FIG. 7B shows a cross-sectional view between II and II'. The separation trenches 58 may extend to the upper surface of the barrier layer 55, for example.

Thereafter, sidewall spacers 61 of an insulating material may be formed on the sidewalls of the charge storage layer 57. Thus, the charge storage layer 57 in the gate stacks is completely surrounded by an insulating material. For example, the insulating material may be thermally grown. Thereafter, a conductive material 60 is deposited over the entire structure. Thereafter, the conductive material may be polished back in a CMP (chemical mechanical polishing) step up to the upper surface of the hard mask layer 59. Then, the conductive material may be etched back to the upper surface of the charge storage layer 57.

Figure 8A:
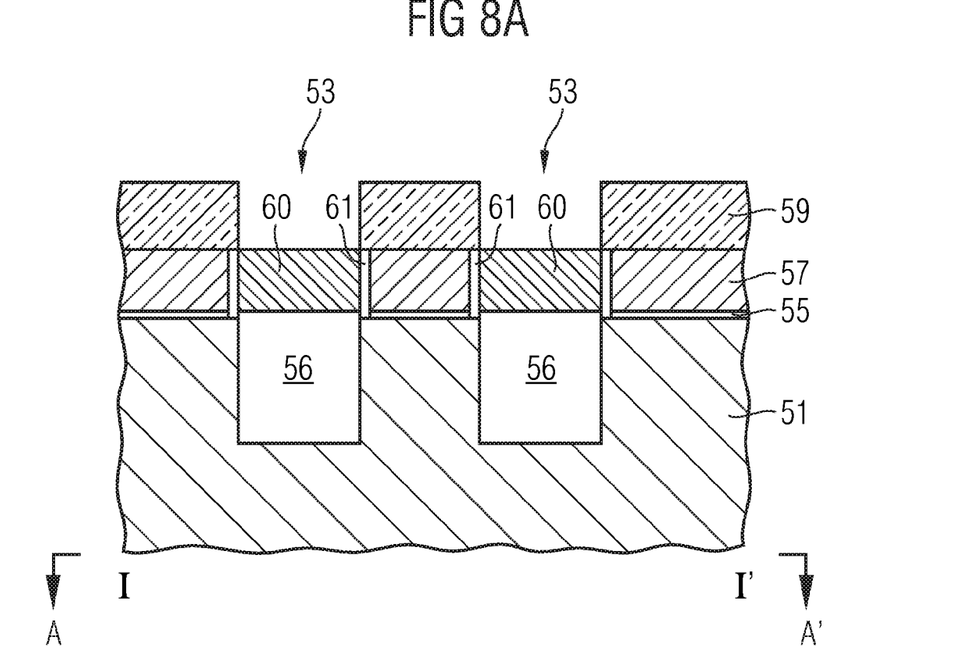
FIGS. 8A and 8B show cross-sectional views of an example of a substrate after performing a further processing step.
Figure 8B:
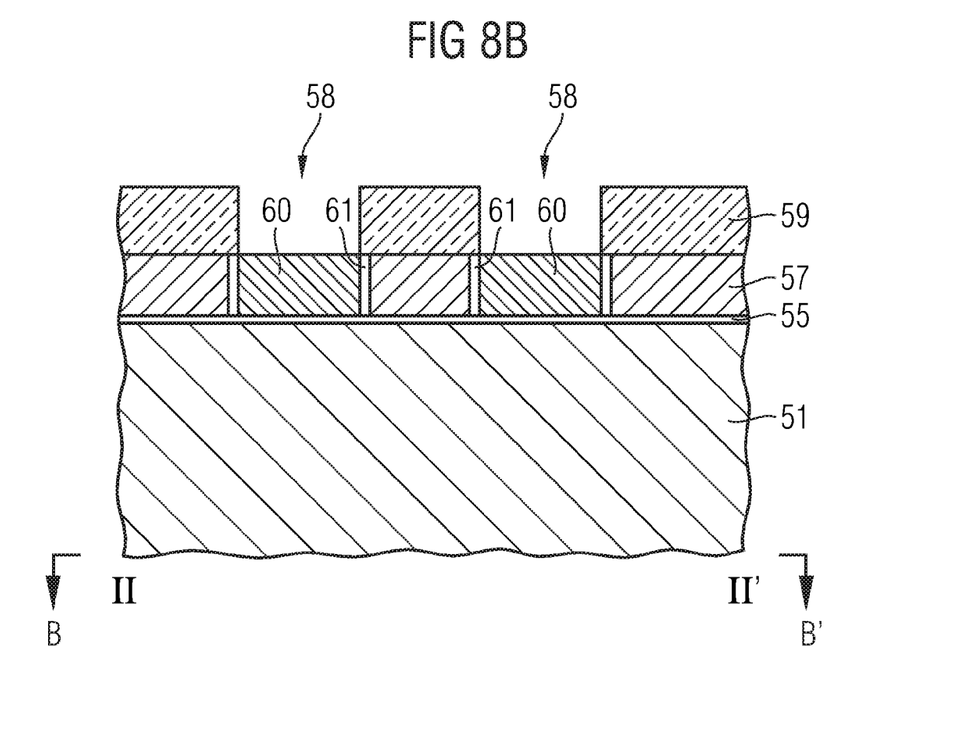

FIGS. 8A and 8B show cross-sectional views of a substrate after performing the processing steps. As is shown, the conductive material 60 is filled in the upper portion of the isolation trenches 53 and in the separation trenches 58. The conductive material 60 is insulated from the charge storage layer 57 by an insulating sidewall spacer 61. The thickness of the conductive material 60 may be selected in such a manner, that the upper surface of the layer 60 is disposed at approximately the same height as the upper surface of the charge storage layer 57. Accordingly, the portions of the charge storage layer 57 that may have the shape of a pillar, may be completely surrounded by the conductive material 60, the conductive material 60 being insulated from the charge storage layer 57 by means of the insulating spacer 61.

Thereafter, optionally, the peripheral portion of the memory device may be formed. For example, a photo mask may be formed, the photo mask covering the memory cell portion and leaving the periphery portion uncovered. On further processing the periphery portion, the conductive layer 60 may be removed from the periphery, by performing a polysilicon etch step using the (not shown) photo mask as a mask. Thereafter, the (not shown) photo mask is removed.

After this polysilicon etch step, the conductive layer 60 forms a grid, the pores of which grid surround the individual floating gate stacks FG having the insulating spacers 61 for insulating the conductive layer 60 from the charge storage layer 57 in between.

Optionally, the (not shown) photo mask may also be patterned in such a manner that portions of the conductive layer 60 are removed from the memory cell array. For example, as has been explained above, the conductive structure 60 may be formed as lines extending parallel to the wordlines, for example. Accordingly, using the (not shown) photo mask as an etching mask portions of the conductive layer 60 may be removed so as to obtain any desired pattern of the conductive layer 60.

In a following process step, the hard mask layer 59 is stripped in an etching step. Thereafter, a CMP-step can be optionally performed in order to planarize the charge storage layer 57 and the conductive layer 60 and the intervening spacers 61.

Figure 9A:
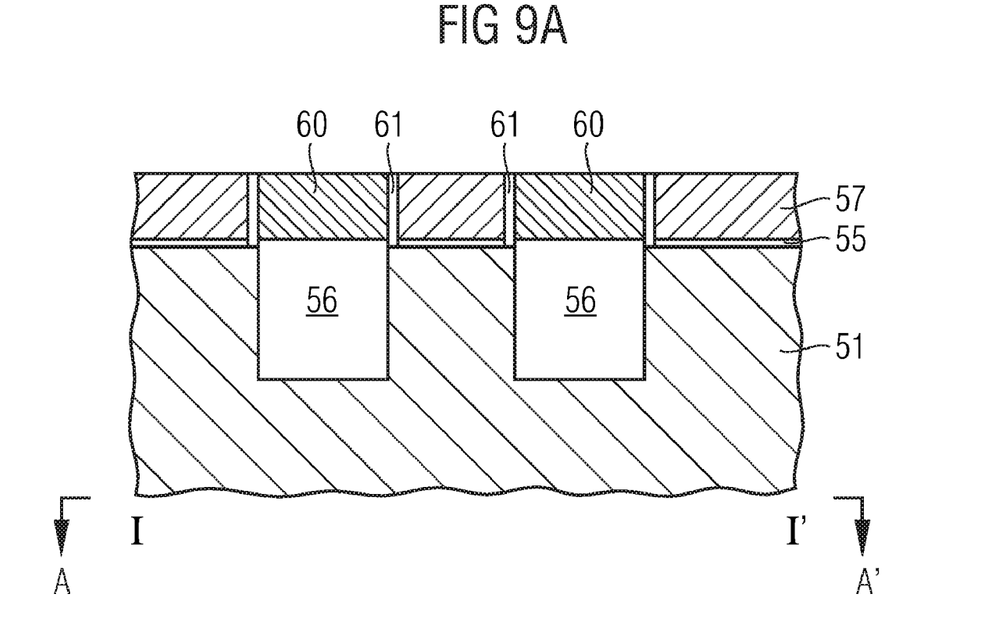
FIGS. 9A and 9B show cross-sectional views of a substrate after performing a planarization step.
Figure 9B:
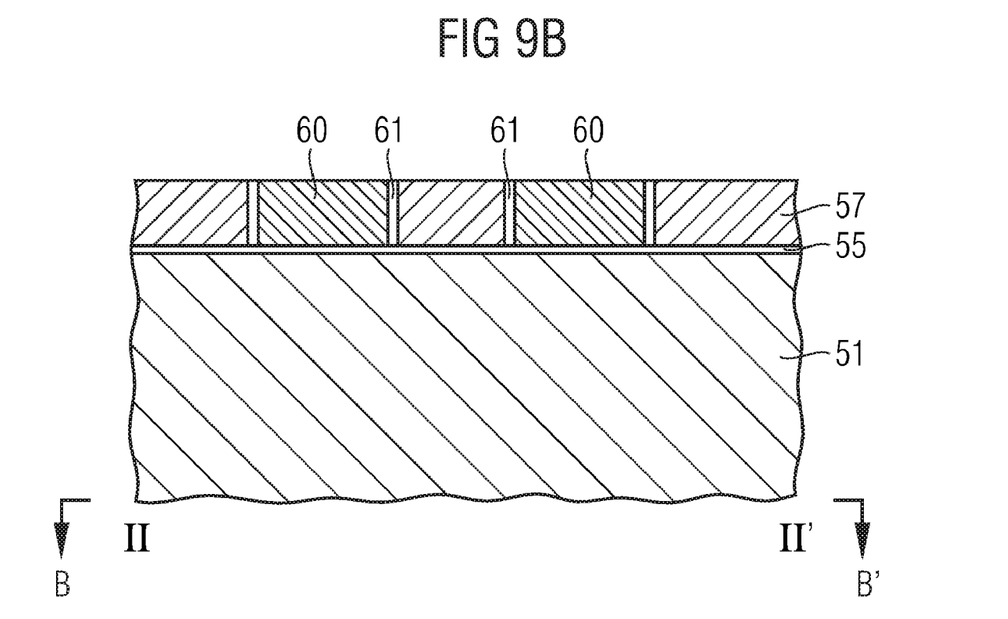

FIGS. 9A and 9B show a cross-sectional view of a substrate according to an example after performing these processing steps. As is shown in FIGS. 9A and 9B, respectively, the upper surface of the conductive layer 60 is disposed approximately at the same height as the upper surface of the charge storage layer 57.

In a following process step which is not illustrated, further process modules for forming peripheral transistors may be conducted.

Figure 10A:
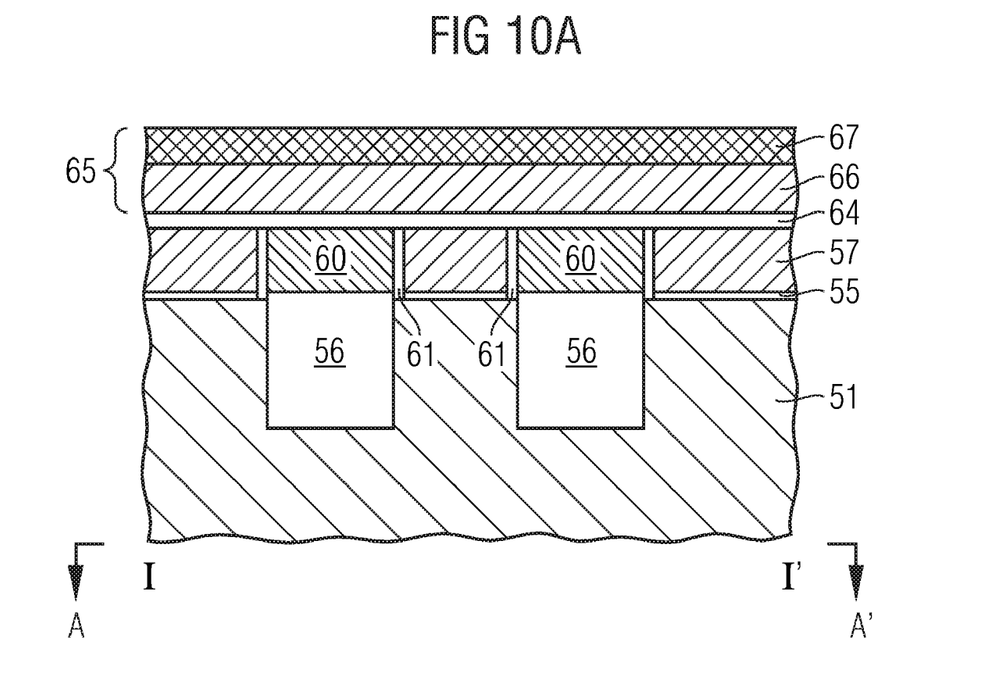
FIGS. 10A and 10B show cross-sectional views of a substrate after depositing further layers.
Figure 10B:
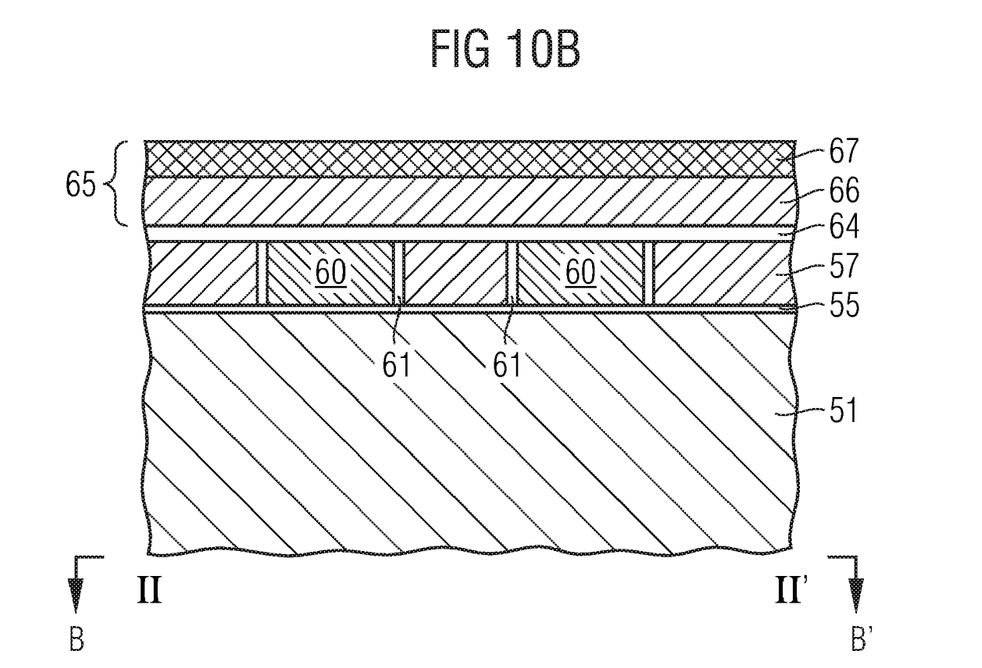

Thereafter, further processing steps for forming the gate stack may be performed, as shown in FIGS. 10A and 10B. For example, first, a dielectric layer 64 may be formed over the charge storage layer 57 and the conductive structure 60. As has been explained above, the dielectric layer may comprise a so-called high-k-dielectric, for example, $HfO_2$. Nevertheless, other dielectric materials, as has been explained above, may be used. In addition any suitable combination of layers may be used, for example, a silicon oxide-silicon nitride-silicon oxide layer stack. Thereafter, a polysilicon layer 66 may be formed over the dielectric layer 64. Then, for example, a conductive layer such as a metal layer 67 that may be made of tungsten may be formed over the polysilicon layer 66. In the formed layer stack, the dielectric layer 64 forms the control electrode dielectric whereas the layers 66, 67 form the control electrode 65 for the floating gate stacks. Thereafter, a suitable capping layer such as a silicon nitride layer may be deposited. Then, the deposited layer stack may be patterned, for example, using a photo mask having a lines/spaces pattern. By patterning the layer stacks, single wordlines 20 that are shown in FIGS. 1A and 1B, for example may be obtained. Thereafter, optionally, a suitable dielectric material may be filled in the spaces between adjacent wordlines. Then, optionally, the connection 49 (FIG. 2) may be formed in the dielectric layer so as to contact the conductive structure 60.

Thus, the floating gate memory structure having shielded NAND strings by introduction of the grid-like conductive layer 60 are formed. Since the shielding conductive layer 60 has a grid shape, capacitive coupling between neighboring floating gate stacks can be prevented.

Figure 11A:
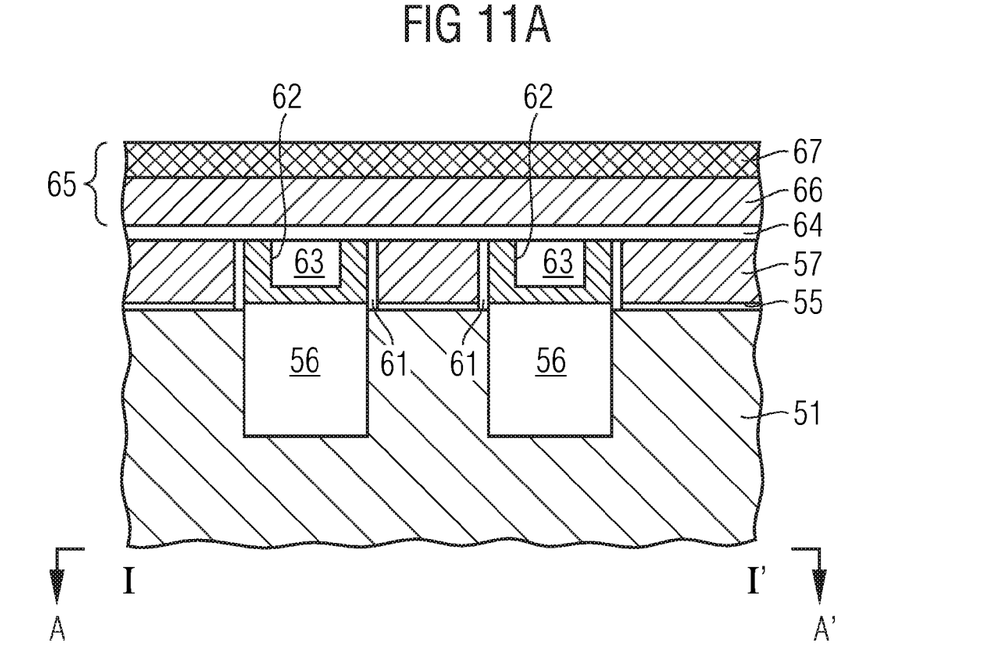
FIGS. 11A and 11B show cross-sectional views of a substrate according to a further embodiment.
Figure 11B:
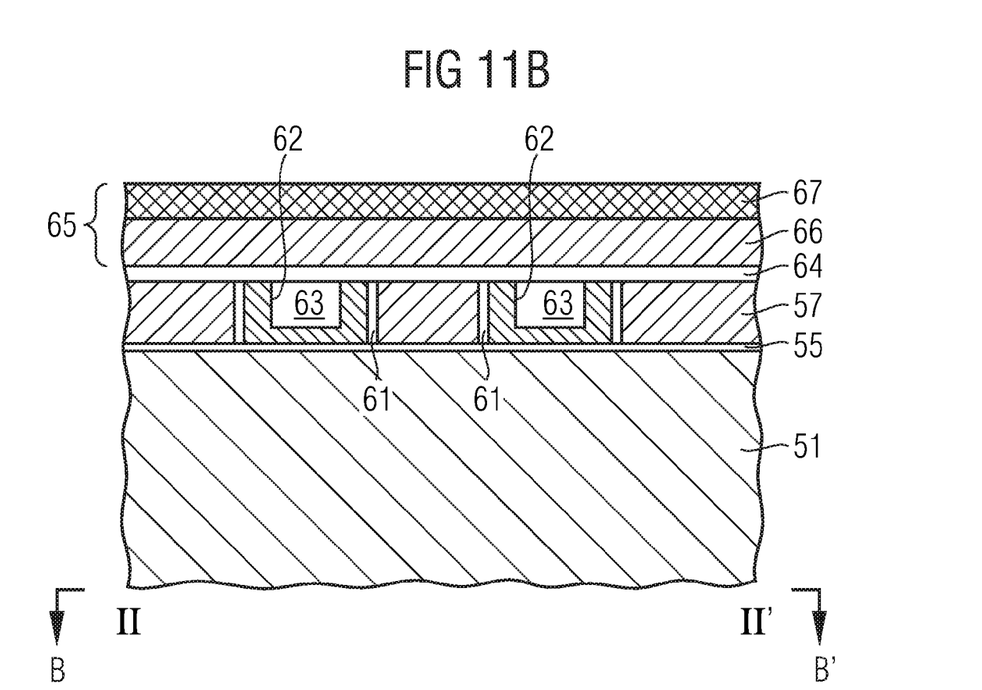

FIGS. 11A and 11B show a schematic layout for illustrating an integrated circuit according to another approach of the present invention.

In the approach shown in FIGS. 11A and 11B, the conductive structure 62 is implemented as a liner in the isolation trenches 53, and the separation trenches 58. The liner is polished back to the upper surface of the hard mask layer 59. Thereafter, an insulating infill 63 is deposited and recessed to the upper surface of the charge storage layer 57. Another method to fabricate this structure comprises forming a conductive liner 62 in the isolation trenches 53 and separation trenches 58. An insulating liner is deposited, which fills the gap in the layer 62. Thereafter both materials are polished back to the surface of layer 59.

Figure 12A:
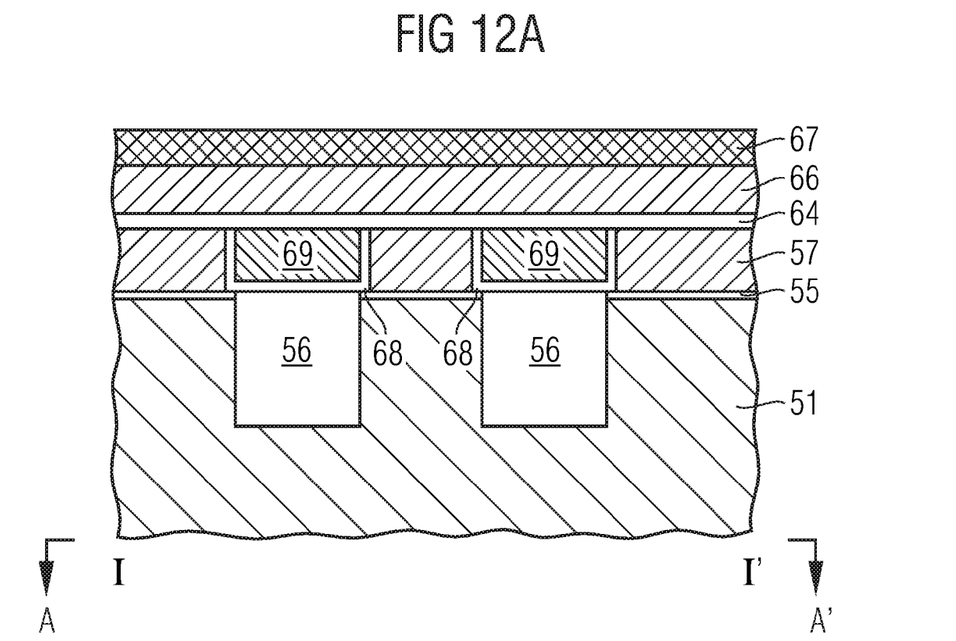
FIGS. 12A and 12B show cross-sectional views of a substrate according to still a further embodiment.
Figure 12B:
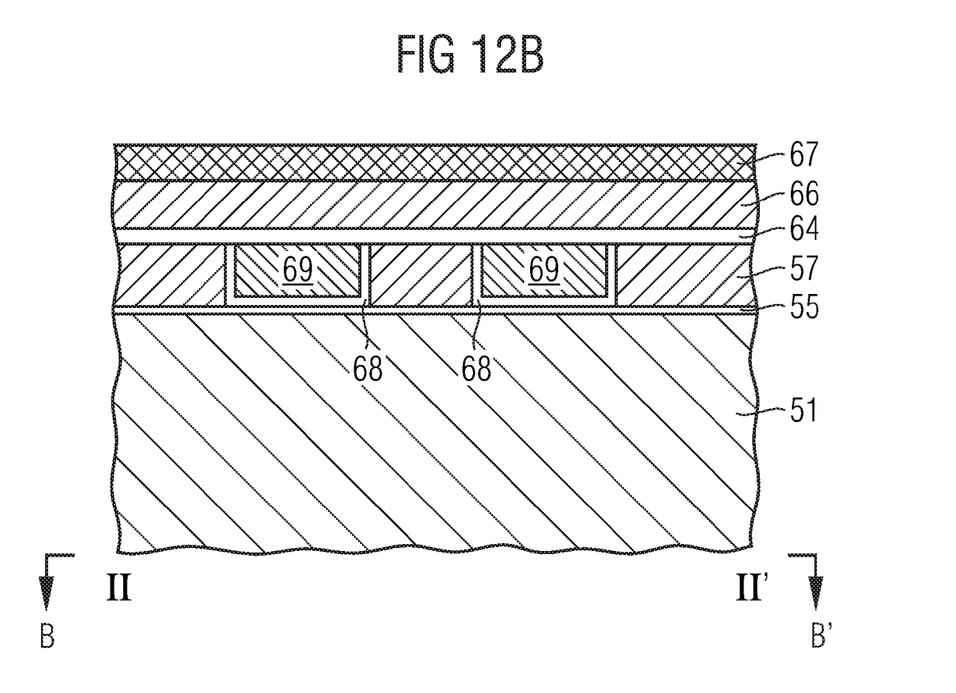

According to another approach shown in FIGS. 12A and 12B, the sidewall spacers 68 are not formed in a thermal oxide process, but in a liner deposition process. The liner 68 is polished back to the upper surface of the hard mask layer 59. Thereafter, the conductive layer 69 is deposited and recessed to the upper surface of the charge storage layer 57.

Although the present invention has been described with reference to preferred approaches, it is not limited thereto, but can be modified in various manners which are obvious for a person skilled in the art. Thus, it is intended that the present invention is only limited by the scope of the claims attached herewith.

Particularly, the present invention is not limited to the material combinations referred to in the above approaches. Moreover, the invention is applicable for any kind of integrated circuits that use charge storage devices having charge storage layers such as charge trapping layers or floating gate layers.

Other systems, methods, features and advantages of the invention will be or will become apparent to one with skill in the art. It is intended that all such additional systems, methods, features and advantages be included within this description, be within the scope of the invention, and be protected by the accompanying claims.

What is claimed is:

1. An integrated circuit, comprising:
   an array of transistors;
   a plurality of wordlines, individual ones of the wordlines being coupled to a plurality of the transistors of the array; and
   conductive structures disposed in a layer beneath the wordlines and arranged between the transistors, the conductive structures being insulated from the wordlines, wherein each of the transistors comprises a charge storage layer disposed in the layer of the conductive structures.

2. The integrated circuit of claim 1, wherein the charge storage layer comprises a polysilicon layer.

3. The integrated circuit of claim 2, wherein sections of the wordlines form control gate electrodes of each of the transistors.

4. The integrated circuit of claim 1, wherein the conductive structures comprise a grid.

5. The integrated circuit of claim 1, wherein the conductive structures extend parallel to a horizontal surface of a semiconductor substrate.

6. An integrated circuit, comprising:
   an array of transistors;
   a plurality of wordlines, individual ones of the wordlines being coupled to a plurality of the transistors of the array; and conductive structures disposed in a layer beneath the wordlines and arranged between the transistors, the conductive structures being insulated from the wordlines, wherein the conductive structures comprise conductive lines extending parallel to the wordlines.

7. An integrated circuit, comprising:

an array of transistors;

a plurality of wordlines, individual ones of the wordlines being coupled to a plurality of the transistors of the array; and conductive structures disposed in a layer beneath the wordlines and arranged between the transistors, the conductive structures being insulated from the wordlines, wherein the conductive structures have a vertical cross-section in which the conductive structures have a greater vertical dimension than horizontal dimension.

8. An integrated circuit, comprising:

an array of transistors;

a plurality of wordlines, individual ones of the wordlines being coupled to a plurality of the transistors of the array; and a conductive structure disposed in a layer beneath the wordlines and arranged between the transistors, the conductive structure being insulated from the wordlines, wherein the conductive structure is embedded in an insulating liner having a U-shaped vertical cross-section.

9. An integrated circuit, comprising:

an array of transistors;

a plurality of wordlines, individual ones of the wordlines being coupled to a plurality of the transistors of the array;

conductive structures disposed in a layer beneath the wordlines and arranged between the transistors, the conductive structures being insulated from the wordlines; and a voltage supply source configured to apply a voltage to the conductive structures.

10. An integrated circuit, comprising:

an array of transistors, wherein a plurality of the transistors are arranged in NAND strings, the strings being separated by insulating trenches;

a plurality of wordlines, individual ones of the wordlines being coupled to a plurality of the transistors of the array; and conductive structures disposed in a layer beneath the wordlines and arranged between the transistors, the conductive structures being insulated from the wordlines.

11. An integrated circuit, comprising:

an array of transistors, wherein each of the transistors comprises a charge storage layer disposed parallel to a horizontal surface of a semiconductor substrate;

a plurality of wordlines, individual ones of the wordlines being coupled to a plurality of the transistors of the array; and conductive structures disposed in a layer beneath the wordlines and arranged between the transistors, the conductive structures being insulated from the wordlines.

12. An integrated circuit, comprising:

an array of transistors;

a plurality of wordlines, individual ones of the wordlines being coupled to a plurality of the transistors of the array;

conductive structures disposed between transistors, the conductive structures being insulated from the wordlines, wherein each of the transistors comprises a charge storage layer disposed in a layer of the conductive structures; and an interconnection configured to connect any of the conductive structures with a fixed potential.

13. The integrated circuit of claim 12, wherein the conductive structures are disposed in a layer beneath the wordlines.

14. The integrated circuit of claim 12, wherein the charge storage layer comprises a polysilicon layer.

15. The integrated circuit of claim 12, wherein sections of the wordlines form control gate electrodes of each of the transistors.

16. An integrated circuit, comprising:

an array of transistors, wherein a plurality of the transistors is arranged in NAND strings, the strings being separated by insulating trenches;

a plurality of wordlines, individual ones of the wordlines being coupled to a plurality of the transistors of the array;

conductive structures disposed between transistors, the conductive structures being insulated from the wordlines; and an interconnection configured to connect any of the conductive structures with a fixed potential.

* * * * *